US008134236B2

(12) United States Patent
Otremba (10) Patent No.: US 8,134,236 B2
(45) Date of Patent: Mar. 13, 2012

(54) ELECTRONIC MODULE WITH SWITCHING FUNCTIONS AND METHOD FOR PRODUCING THE SAME (75) Inventor: Ralf Otremba, Kaufbeuren (DE)

(73) Assignee: Infineon Technologies, AG, Neubiberg (DE)

( * ) Notice: Subject to any disclaimer, the term of this patent is extended or adjusted under 35 U.S.C. 154(b) by 203 days.

(21) Appl. No.: 11/773,474

(22) Filed: Jul. 5, 2007

(65) Prior Publication Data

US 2008/0006923 A1 Jan. 10, 2008

(30) Foreign Application Priority Data

Jul. 5, 2006 (DE) .................. 10 2006 031 405

(51) Int. Cl.
H01L 29/40 (2006.01)
(52) U.S. Cl. .................. 257/777; 257/E23.085
(58) Field of Classification Search .................. 257/150, 257/177, 686, 772, 777, 779, E23.085, E23.023
See application file for complete search history.

(56) References Cited

U.S. PATENT DOCUMENTS

| 5,532,512 | A  | * | 7/1996  | Fillion et al. ................. 257/686 |
| 5,825,090 | A  |   | 10/1998 | Piccone |
| 5,901,901 | A  |   | 5/1999  | Schneegans et al. |
| 6,326,088 | B1 |   | 12/2001 | Mayer et al. |
| 6,462,723 | B1 | * | 10/2002 | Yamazaki et al. ............. 345/82 |
| 6,803,627 | B2 | * | 10/2004 | Pfirsch ........................ 257/341 |
| 6,867,471 | B2 |   | 3/2005  | Goller et al. |
| 7,291,869 | B2 | * | 11/2007 | Otremba ...................... 257/107 |
| 2003/0148597 | A1 | * | 8/2003  | Tan et al. ..................... 438/612 |
| 2005/0048758 | A1 | * | 3/2005  | Hosseini et al. .............. 438/614 |
| 2006/0017174 | A1 | * | 1/2006  | Otremba ....................... 257/778 |
| 2006/0043539 | A1 | * | 3/2006  | Thomas et al. ............... 257/659 |
| 2006/0055051 | A1 |   | 3/2006  | Hubner |
| 2006/0076660 | A1 |   | 4/2006  | Boschlin et al. |
| 2007/0025684 | A1 | * | 2/2007  | Otremba ...................... 385/147 |

FOREIGN PATENT DOCUMENTS

| DE | 10015962 A1 | 10/2001 |
| DE | 10126309 A1 | 12/2002 |
| DE | 10303588 A1 | 8/2004 |

(Continued)

OTHER PUBLICATIONS

Lu, D.H., et al. "Integrated Bi-directional Trench Lateral Power MOSFETs for One Chip Lithium-ion Battery Protection ICs", IEEE, 07803-8889-5/05 (2005), pp. 355-356.

(Continued)

Primary Examiner — Ha Tran T Nguyen
Assistant Examiner — Vongsavanh Sengdara
(74) Attorney, Agent, or Firm — Edell, Shapiro & Finnan, LLC (57) ABSTRACT An electronic module with switching functions includes integrated circuit chips arranged in a chip stack. The integrated circuit chips of the chip stack in each case includes a large-area contact on the top side and/or the rear side, the areal extent of the large-area contact completely occupies the top side and/or the rear side of the integrated circuit chip. A diffusion solder layer is arranged between mutually aligned large-area contacts of the stacked integrated circuit chips, the diffusion solder layer extending as far as the edges of the integrated circuit chips. A method for producing an electronic module with switching functions includes aligning and diffusion-soldering integrated circuit wafers with one another by their rear sides.

10 Claims, 6 Drawing Sheets

FOREIGN PATENT DOCUMENTS

| | | |
|---|---|---|
| DE | 102004046699 A1 | 4/2006 |
| DE | 102004058877 A1 | 4/2006 |
| EP | 1432036 A2 | 6/2004 |
| WO | 9209099 | 5/1992 |
| WO | 0186714 A1 | 11/2001 |
| WO | 2006021191 A1 | 3/2006 |

OTHER PUBLICATIONS

Sawle, Andrew, et al., "Novel Power MOSFET Packaging Technology Doubles Power Density in Synchronous Buck Converters for Next Generation Microprocessors," International Rectifier, APEC Conference, (2002).

\* cited by examiner

ELECTRONIC MODULE WITH SWITCHING FUNCTIONS AND METHOD FOR PRODUCING THE SAME

CROSS REFERENCE TO RELATED APPLICATIONS

This application claims priority under 35 U.S.C. §119 to Application No. DE 102006031405.0 filed on Jul. 5, 2006, entitled "Halbleitermodul mit Schaltfunktionen und Verfahren zur Herstellung desselben," the entire contents of which are hereby incorporated by reference.

BACKGROUND

Know semiconductor modules include switching functions, wherein the switching functions are arranged monolithically on a semiconductor chip. The complexity of such monolithic solutions entails the risk of an increased failure rate during fabrication. Moreover, the chip costs are higher than in the case of discrete solutions in which discrete semiconductor chips are interconnected on a common circuit board. However, this solution also has the disadvantage that despite cost-effective fabrication, the semiconductor module cannot be miniaturized further and has significantly larger external dimensions than the monolithic solution.

SUMMARY

An electronic module with switching functions and a method for producing the same are described herein. An electronic module of this type may be used in the current and voltage supply with switching and/or protection functions. The electronic module with switching functions includes integrated circuit chips arranged in a chip stack. The integrated circuit chips of the chip stack in each case includes a large-area contact on the top side and/or the rear side, the areal extent of the large-area contact completely occupies the top side and/or the rear side of the integrated circuit chip. A diffusion solder layer is arranged between mutually aligned large-area contacts of the stacked integrated circuit chips, the diffusion solder layer extending as far as the edges of the integrated circuit chips. A method for producing an electronic module with switching functions includes aligning and diffusion-soldering integrated circuit wafers with one another by their rear sides. The electronic module is provided with an areal extent being reduced and the fabrication cost for the production of the electronic module is likewise reduced.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The electronic module and method for producing the same will now be explained in more detail with reference to the accompanying figures, where:

FIGS. 2 to 9 show schematic cross sections of components in the production of the semiconductor module in accordance with FIG. 1;

DETAILED DESCRIPTION

An electronic module, such as a semiconductor module, with switching functions and a method for producing the same are described herein. The semiconductor module includes for the switching functions integrated circuit chips, such as semiconductor chips, arranged in a chip stack. The semiconductor chips of the semiconductor chip stack in each case have a large-area contact on the top side and/or the rear side, the areal extent of which contact completely occupies the top side and/or the rear side of the semiconductor chip. A diffusion solder layer is arranged between the mutually aligned large-area contacts of the stacked semiconductor chips, the diffusion solder layer extending as far as the edges of the semiconductor chips.

An electronic module of this type has the advantage that the area taken up can be halved again by comparison with a monolithically integrated semiconductor module. In this case, the increase in the height of the semiconductor chip stack is extremely small, especially as the semiconductor chips are diffusion-soldered by their rear sides, practically rear side to rear side, and no interposer or interlayers whatsoever are provided. If, in addition, the semiconductor chips of the semiconductor chip stack of the semiconductor module are, for example, thinned in terms of their thickness, it can be assumed that even the device height is identical to a monolithic solution. Consequently, a further miniaturization with regard to the module volume can advantageously be achieved with the described power wafer stack. Furthermore, chip cost advantages of this discrete chip solution can be combined with a moderate mounting cost increase since the large-area diffusion-soldered connection of two semiconductor chips, optionally of two "power MOSFETs", can take place at the wafer lever, whereby a multiplicity of semiconductor chip stacks can be produced in parallel. A further advantage is that the connection of the semiconductor chips in the semiconductor chip stack via diffusion solder enables the later mounting of these semiconductor chip stacks without reducing the temperature profiles, since the diffusion solder connection is for the most part converted into a connection composed of intermetallic phases and having a higher melting point. Consequently, optionally the diffusion solder layer of semiconductor wafers which are diffusion-soldered onto one another and whose large-area rear side contacts occupy the rear sides of the semiconductor wafers are characterized by the fact that they completely cover the semiconductor wafer rear sides.

In one exemplary embodiment, the semiconductor chips of the semiconductor chip stack have first and second power electrodes, wherein the first power electrodes are stacked one on top of another as large-area contacts and the diffusion solder layer is arranged between the first power electrodes. Furthermore, the semiconductor chip stack includes both on its top side and on its underside second power electrodes as large-area contacts, the areal extent of which, however, only almost covers the top side and the underside of the semiconductor chip stack. The top side and the underside of the semiconductor chip stack in each case comprise a small-area control electrode in addition to the second large-area power electrodes.

In this context, areal extent is understood to mean the two-dimensional order of magnitude of the power electrodes which cooperate with one another. In the case of the first power electrode, the latter completely covers the rear side of a semiconductor chip in the semiconductor chip stack, such that the diffusion solder layer reaches as far as the edges of the semiconductor chips, whereas although the second power electrodes have a large area, they leave free a part of the top sides and also the underside of the semiconductor chip stack for small-area control electrodes. In this context, small-area means that the area ratio between small-area and large-area is less than 1:4.

In a further exemplary embodiment, the electronic module comprises on its underside, as surface-mountable external contacts, two large-area second power electrodes and two small-area control electrodes, wherein the diffusion solder layer within the electronic module electrically and mechanically connects large-area first power electrodes of the semiconductor chips.

Optionally, the external contacts are formed via leads, wherein the semiconductor chip stack is fixed on leads which form surface-mountable flat external contacts of the semiconductor module. For this purpose, a first lead is connected to a second power electrode of the underside of the semiconductor chip stack. A second lead is electrically and mechanically connected to a control electrode of the underside of the semiconductor chip stack, and a third lead is electrically connected via a connecting element within the semiconductor module to a further second power electrode on the top side of the semiconductor chip stack and a fourth lead is electrically connected via a further connecting element to a further control electrode on the top side of the semiconductor chip stack. Consequently, the semiconductor module can be electrically connected to a superordinate circuit board by the flat external contacts arranged on the underside of the semiconductor module.

This arrangement is optionally incorporated into a plastic housing, in the plastic housing composition of which are embedded the semiconductor chip stack, the connecting elements and the surfaces of leads, wherein external contact areas of the leads on the underside of the semiconductor module are, however, kept free of plastic housing composition. Such a semiconductor module can practically be arranged on any desired top side of a superordinate circuit board, the external dimensions of such a lead module being minimized further in comparison with conventional solutions such as monolithic modules.

In order to achieve a reliable solder connection between the two semiconductor chips of the semiconductor chip stack, the diffusion solder layer comprises at least one of the substances AuSn, AgSn, CuSn, AuSi, AuGe and/or InAg as diffusion solder material. These diffusion materials have the advantage that they have already been tried and tested in semiconductor technology, but have not been used hitherto for mechanically and electrically connecting large-area rear sides of semiconductor wafers to one another.

This solution affords the abovementioned advantage, however, that considerable chip cost advantages of a discrete solution can be realized with a moderate or small mounting cost increase, in which case the connection of the large-area first power electrodes on the rear sides of semiconductor wafers can take place at the wafer level, and a plurality of chip stacks can thus be produced in parallel.

In this case, the first power electrode connected via diffusion solder may comprise a drain electrode and the second power electrode may include a source electrode of a vertical field effect power semiconductor component. The control electrode may, for its part, be a vertical trench gate electrode or else a lateral gate electrode. However, switching functions can also be based on vertical IGBT components (insulated gate bipolar transistors). For this purpose, the first power electrode forms the collector electrode and the second power electrode forms the emitter electrode of these stacked vertical IGBTs having a vertical drift path. The control electrode is formed by an insulating gate electrode. Optionally, such semiconductor modules in a semiconductor chip stack may be used as a battery protection circuit, which will be discussed later with reference to the figures.

A method for producing a plurality of semiconductor chip stacks for semiconductor modules comprises the following method steps.

The first step involves producing semiconductor wafers with a layer of diffusion solder material on their rear sides. Afterward, in each case two semiconductor wafers are pressed onto one another by their rear sides while heating to diffusion soldering temperature and with the formation of intermetallic phases having a high melting point in a diffusion solder layer. After the diffusion solder layer has been formed, the semiconductor wafers can be separated into individual semiconductor chip stacks.

This method has an advantage that semiconductor chip stacks arise in which in terms of their thickness have essentially only double the thickness of a semiconductor wafer. If the semiconductor wafer is thinned, then it is ultimately possible to achieve a thickness of the semiconductor stack which corresponds to the thickness of monolithically integrated circuits with switching functions, but with the advantage that the structure is essentially halved in terms of the areal extent.

A method for producing a plurality of semiconductor modules furthermore includes the method steps of first preparing a leadframe with a plurality of semiconductor module positions with two large-area lead contact areas and two small-area lead contact areas on leads. Onto a leadframe prepared in this way, it is then possible to apply in the semiconductor module positions the semiconductor chip stacks by a large-area second power electrode and a control electrode of their undersides onto the provided leads of the leadframe in the semiconductor module positions. This is followed by fitting connecting elements between further second power electrodes and respectively control electrodes on the top side of the semiconductor chip stacks and the respectively provided leads of the leadframe in the semiconductor module positions. Finally, the semiconductor chip stack, the connecting elements and also the lead contact areas are packaged into a plastic housing composition while leaving free external contact areas of the leads of the leadframe on the undersides of the semiconductor modules. Since a plurality of semiconductor modules arise directly on the leadframe, the semiconductor modules can then be singulated by separating the leadframe.

In this method, diffusion solder material is applied to the rear sides of the semiconductor wafers, the diffusion solder material comprising at least one of the substances: AuSn, AgSn, CuSn, AuSi, AuGe and/or InAg and forming at a diffusion soldering temperature intermetallic phases whose melting points are higher than the actual diffusion soldering temperature. For this purpose, the semiconductor wafers are heated during diffusion soldering to a diffusion soldering temperature $T_D$ of between $180°\,C.\leqq T_D \leqq 460°\,C$. Depending on the composition of the diffusion solder material and the resultant intermetallic phases, with these low diffusion soldering temperatures it is possible to achieve solder connections which can withstand subsequent fabrication steps at far more than 460° C. without being damaged.

In the semiconductor chip positions on the semiconductor wafers there can be applied field effect semiconductor components including a vertical drift path and a vertical trench gate structure and also source electrodes as second power electrodes, wherein a large-area drain electrode as first power electrode is applied on the rear sides of the semiconductor wafers. On the other hand, in the method it is also possible to apply in the semiconductor chip positions on the semiconductor wafers semiconductor components of the IGBT type including a vertical drift path and a lateral gate structure and also including emitter electrodes as second large-area power electrodes. In this case, a large-area collector electrode as first power electrode is applied to the rear side of the semiconductor wafers. In order to diffusion-solder these collector electrodes or the drain electrodes on the rear sides of the semiconductor wafers, a contact pressure is exerted on the wafers lying one on top of another, which contact pressure compensates for minimal warpage of the semiconductor wafers, so that, in an advantageous manner, metals of the diffusion layer that diffuse into one another lie with their interfaces as close together as possible.

The semiconductor wafers connected via a diffusion solder layer between their rear sides can be separated into semiconductor chip stacks via sawing technology. In this case, a laser separating technique is also conceivable and advantageous.

A metal plate, optionally a planar copper plate, can be structured for the purpose of producing a leadframe that is suitable for semiconductor modules of this type. For the purpose of structuring the planar metal plate, it is possible, on the one hand, to use stamping tools, and on the other hand it is also possible to structure the metal plate by wet or dry etching. This results in steep etching edges, particularly during anisotropic plasma etching, which furthermore has the advantage that minimal and complex structures can be realized.

A further option for producing a leadframe comprises in electrodepositing the leadframe structure on an auxiliary carrier and subsequently removing it from the auxiliary carrier. Electrodeposition has the advantage that a lead coating corresponding to a solder material, and in particular to a diffusion solder material, can already be effected in the final phase, thereby facilitating the application and fixing of the semiconductor chip stacks onto the leadframe.

Beside soldering the semiconductor chip stacks on the leads of the leadframe, it is also possible to fix and electrically connect the semiconductor chip stack with the aid of a conductive adhesive.

For the purpose of applying the semiconductor chip stacks by a second power electrode and a control electrode of their undersides onto the provided leads of the leadframe in the semiconductor module positions of the leadframe, use can be made of a diffusion solder technique at different diffusion soldering temperatures when stacking the semiconductor wafers. This is possible by virtue of the different diffusion solder components.

As connecting elements between control electrodes of the top side of the semiconductor chip stacks and the provided leads of the leadframe, bonding wire connections are optionally provided in the semiconductor module positions. For fitting connecting elements between large-area second power electrodes of the top side of the semiconductor chip stacks and the provided leads of the leadframe, bonding tape or clamping connections are provided for a higher current loading.

For the purpose of packaging the semiconductor chip stack and the connecting elements and also the lead contact areas into a plastic housing composition while leaving free external contact areas of the leads of the leadframe on the undersides of the semi-conductor modules, an injection-molding technique can advantageously be employed. As an alternative, however, dispensing techniques that work in a pressureless manner are also possible. When using screen printing techniques, the plastic housing composition can advantageously be applied selectively at the semiconductor module positions on the leadframe.

For the purpose of separating the leadframe into individual semiconductor modules, an etching method is optionally used, but laser removal methods and possibly also stamping methods are also able to bring about the separation of the leadframe.

Exemplary embodiments of an electronic module and method of producing the same are described below with reference to the figures.

Figure 1:
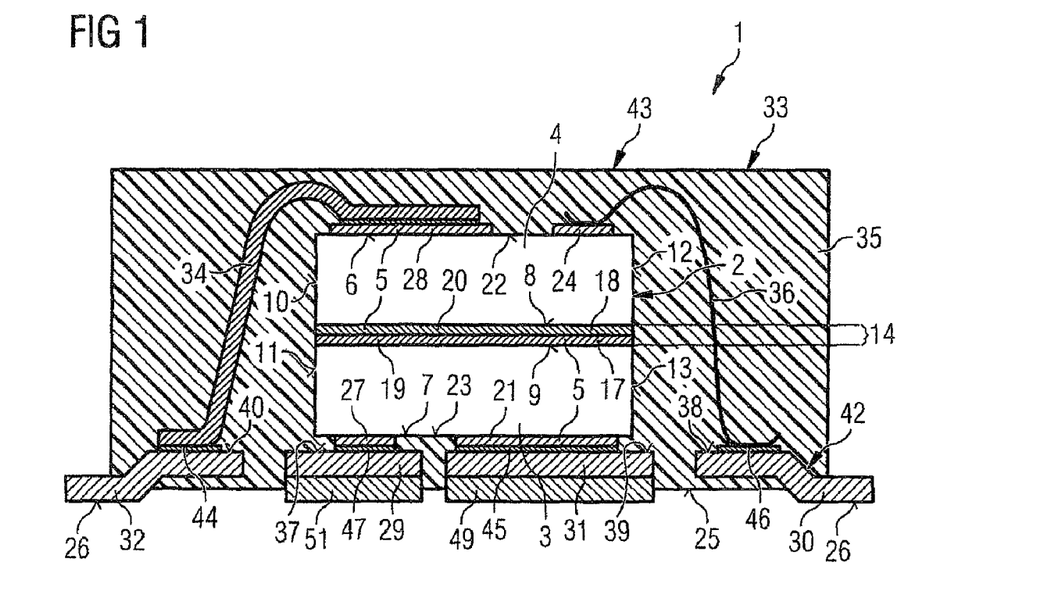
FIG. 1 shows a schematic cross section through a semiconductor module of a first exemplary embodiment.

FIG. 1 shows a schematic cross section through an electronic module 1, such as a semiconductor module, of a first embodiment. In this embodiment, two integrated circuit chips 3 and 4, such as semiconductor chips, having an identical areal extent are soldered onto one another with their large-area contacts 5 on their rear sides 8 and 9 to form a chip stack 2. In this embodiment, they are two identical discrete semiconductor components which are first diffusion-soldered onto one another as semiconductor wafers, such that a diffusion solder layer 14 is arranged between the two stacked semiconductor chips 3 and 4 after the separation of the two semiconductor wafers that have been diffusion-soldered onto one another. However, the invention can also be applied to discrete and integrated circuits as long as the chip grid of the semiconductor wafers that are soldered onto one another is identical.

Thus, not only is it possible, as in this example, to stack field effect power transistors with their drain electrodes on the rear side as discrete components, but a combination of a control semiconductor chip with a power switch or a logic chip with a control chip is also possible, in which case it is important that the chip grids of the semiconductor wafers that are stacked one on top of another and are connected to one another are identical. This identity of the areal extent of the semiconductor chips 3 and 4 stacked one on top of another also gives rise to the special characteristic of this semiconductor chip stack 2 in the case of which the diffusion solder layer 14 of the stacked semiconductor chips 3 and 4, as shown in FIG. 1, extends as far as the edges 10, 11, 12 and 13 of the semiconductor chips 3 and 4.

The top sides 6 and 7 of the stacked semiconductor chips 3 and 4 likewise have large-area contacts 5, which, however, only almost cover the top sides 6 and 7 of the semiconductor chips 3 and 4, with the result that a small-area control electrode 24 and 27 can additionally be arranged on the top side 22 and on the underside 23 of the semiconductor chip stack 2. The rear side contacts 17 and 18 in the middle of the semiconductor chip stack 2 may constitute large-area power electrodes such as drain electrodes of a field effect transistor. Moreover, the first power electrodes 19 and 20 may also be collector electrodes of a discrete IGBT component. The large-area second power electrode 21 arranged on the underside 23 of the semiconductor chip stack 2 and the small-area control electrode 27 are directly connected via a large-area contact area 45 and a small-area contact area 47 of leads 31 and 29, respectively, to external contacts 49 and 51, respectively, on the underside 25 of the semiconductor module 1.

Further leads 30 and 32 of a leadframe 43 are provided for the second power electrode 28 and the second control electrode 24 on the top side 22 of the semiconductor stack 2. In order to electrically connect the large-area second power electrode 28 on the top side 22 of the semiconductor chip stack 2 to the lead 32 and the large-area lead contact area 44 thereof on the underside 25 of the semiconductor module 1, a high-current-resistant connecting element 34 composed of a bonding tape and/or a plurality of aluminum bonding wires is provided. For the connection between the control electrode 24 on the top side 22 of the semiconductor chip 2 and a lead 30 with the small-area lead contact area 46, a thin bonding wire is provided as a connecting element 36. Consequently, the electrodes of the top side 22 of the semiconductor chip stack 2 can be accessed externally via the external contacts 26 of the leads 30 and 32. The semiconductor chip stack 2, the connecting elements 34 and 36 and also surfaces 37, 38, 39 and 40 of the leads 29, 30, 31 and 32 are embedded into a plastic composition 35 of a plastic housing 33, so that only the external contacts 26, 49 and 51 remain free of plastic housing composition 35 as surface-mountable external contacts on the underside 25 of the semiconductor module 1.

FIGS. 2 to 9 show schematic cross sections of components in the production of the electronic module 1 in accordance with FIG. 1. Components having the same functions as in FIG. 1 are identified by the same reference symbols in FIGS. 2 to 9 and are not discussed separately.

Figure 2:
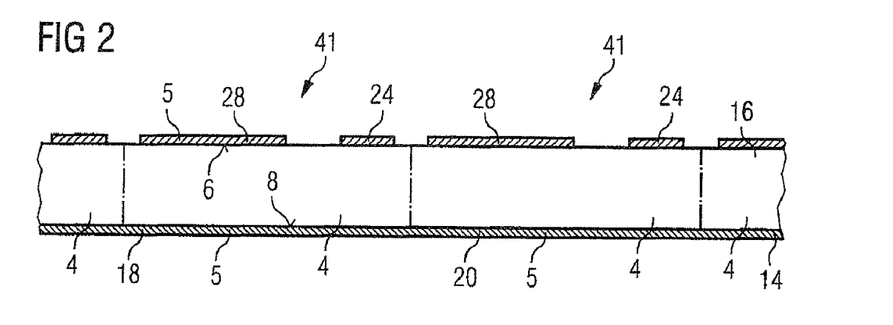
FIG. 2 shows a schematic cross section through a semiconductor wafer with semiconductor chip positions.

FIG. 2 shows a schematic cross section through an integrated circuit wafer 16, such as a semiconductor wafer, with chip positions 41. In the chip positions 41, large-area contacts 5 in the form of second power electrodes 28, which constitute source electrodes in this embodiment, are arranged on the top side 6 of the semiconductor wafer 16, wherein the large-area second power electrodes 28 do not completely cover the top side 6 of a semiconductor chip position 41 of the semiconductor wafer 16, but rather still leave space free for a control electrode 24, which in this embodiment is a gate electrode having a vertical gate structure. The entire rear side 8 of the semiconductor wafer 16 is covered by a diffusion solder layer 14 as rear side contact 18 of the semiconductor wafer 16 and forms a first power electrode 20, which constitutes a drain electrode in this embodiment of the invention, in the individual semiconductor chip positions 41.

Figure 3:
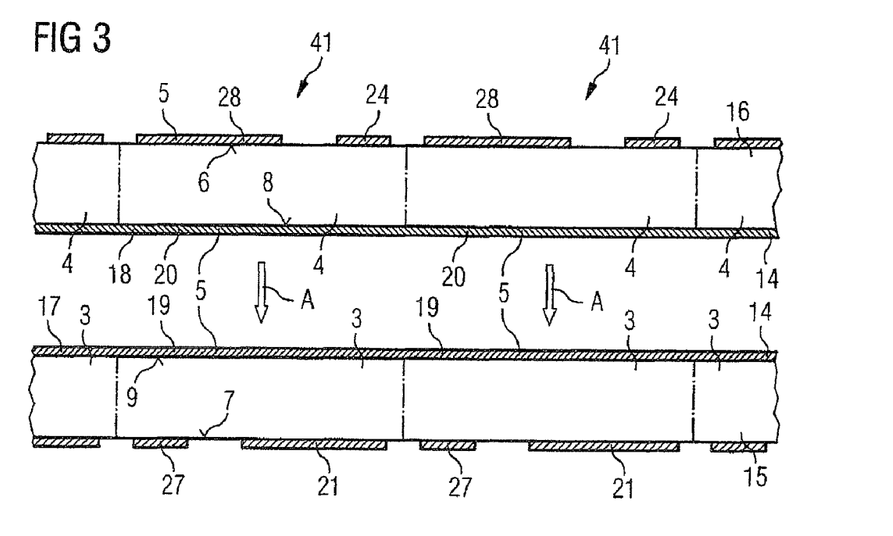
FIG. 3 shows a schematic cross section through two semiconductor wafers aligned with one another.

FIG. 3 shows a schematic cross section through two integrated circuit wafers 15 and 16, such as semiconductor wafers, aligned with one another, wherein the semiconductor wafer 15 lies with its rear side 9 opposite the rear side 8 of the semi-conductor wafer 16, such that the two rear sides 8 and 9 can be pressed onto one another in arrow direction A and, at a diffusion soldering temperature, the diffusion solder materials of the diffusion solder layers 14 can form intermetallic phases and mechanically fix and electrically connect the semiconductor wafer 15 onto and to the semiconductor wafer 16 electrically via the drain contacts or the first power electrodes 19 and 20 in the chip positions 41. The second large-area power electrodes 21 and 28 arranged on the top sides 6 and 7 of the semiconductor wafers 15 and 16 in the chip positions 41 here form the source electrodes of the semiconductor chips and the small-area control electrodes 24 and 27 form the gate electrodes of these MOSFET power semiconductor components.

Figure 4:
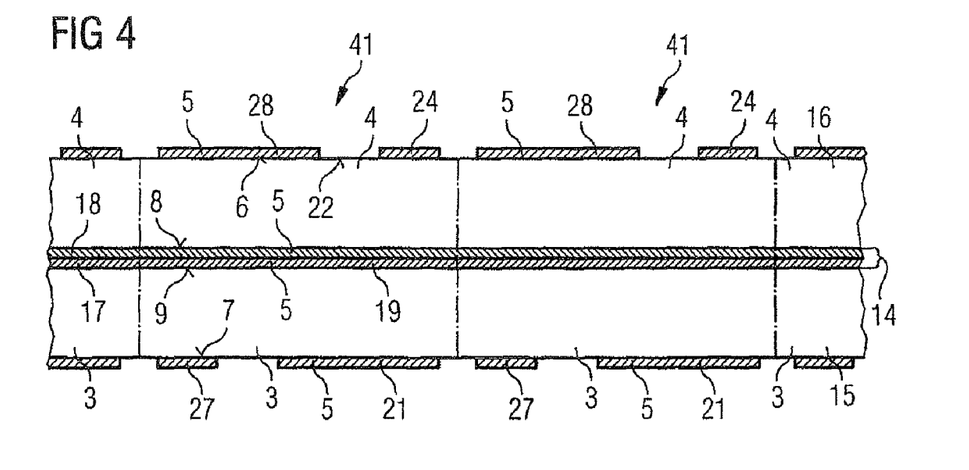
FIG. 4 shows a schematic cross section through the two semiconductor wafers from FIG. 3 after diffusion soldering.

FIG. 4 shows a schematic cross section through the two integrated circuit wafers 15 and 16 from FIG. 3 after diffusion soldering at a diffusion soldering temperature $T_D$ of between $180°\,C. \leq T_D \leq 460°\,C$. Via this soldering of the two semiconductor wafers 15 and 16, it is possible to produce a plurality of chip stacks in the chip positions 41 of the semiconductor wafers 15 and 16 if the chip grid of the two semiconductor wafers 15 and 16 is identical. In this respect, this technique can also be applied to other combinations of integrated circuit wafers and is not restricted to the example explained here.

Figure 5:
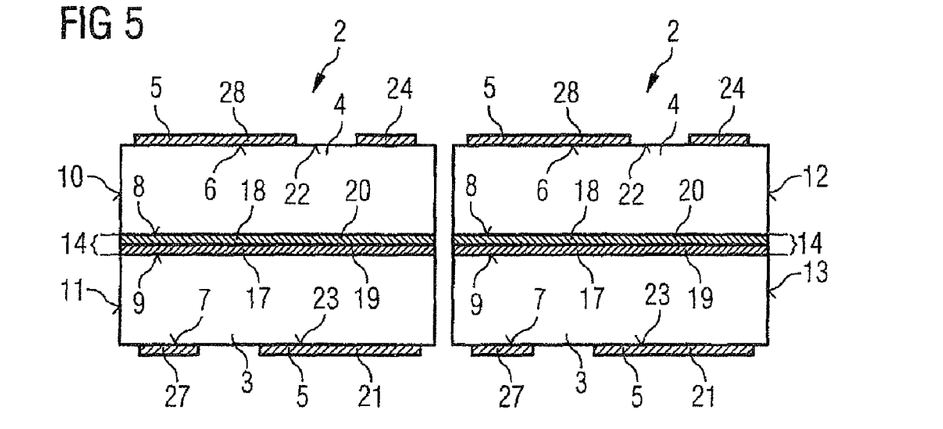
FIG. 5 shows schematic cross sections through semiconductor chip stacks after separation of the diffusion-soldered semiconductor wafers in accordance with FIG. 4.

FIG. 5 shows a schematic cross section through the chip stack 2 after separation of the diffusion-soldered wafers 15 and 16 in accordance with FIG. 4. The chip stacks 2 now have on their undersides 23 a small-area control electrode 27 and a large-area second power electrode 21 and a further control electrode 24 and a large-area second power electrode 28 are situated on the top side 22 of the chip stack. The first power electrodes 19 and 20 on the rear sides 8 and 9 of the semiconductor chips 3 and 4 are connected to one another via the diffusion solder layer 14.

Figure 6:
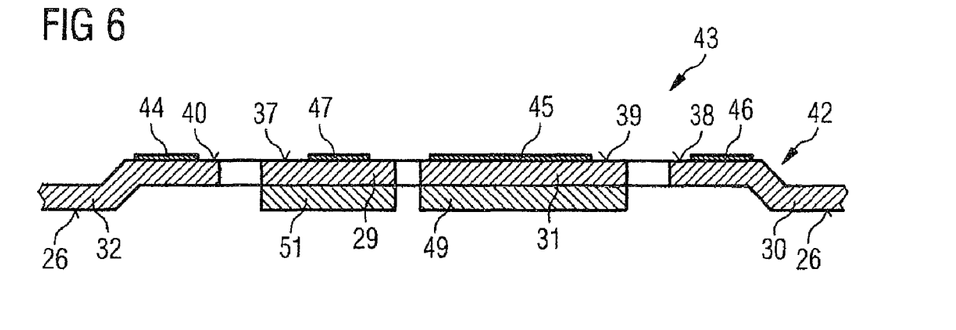
FIG. 6 shows a schematic cross section through a semiconductor module position of a leadframe prior to the application of a semiconductor chip stack in accordance with FIG. 5.

FIG. 6 shows a schematic cross section through an electronic module position 43 of a leadframe 42 prior to the application of a semiconductor chip stack in accordance with FIG. 5. The leadframe 42 has in the central region the leads 29 and 31 with corresponding lead contact areas 47 and 45, respectively, which correlate in terms of their areal extent with a control electrode, on the one hand, and with a power electrode, on the other hand. Furthermore, the leadframe 42 includes in each of the module positions 43 further leads 30 and 32 which provide a small-area lead contact area 46 and a large-area lead contact area 44 in order to be connected to the electrodes of the top side of the chip stack. The central leads 29 and 31 are reinforced by external contacts 51 and 49 in order to achieve the same external contact level of the external contacts 26 of the offset leads 30 and 32.

Figure 7:
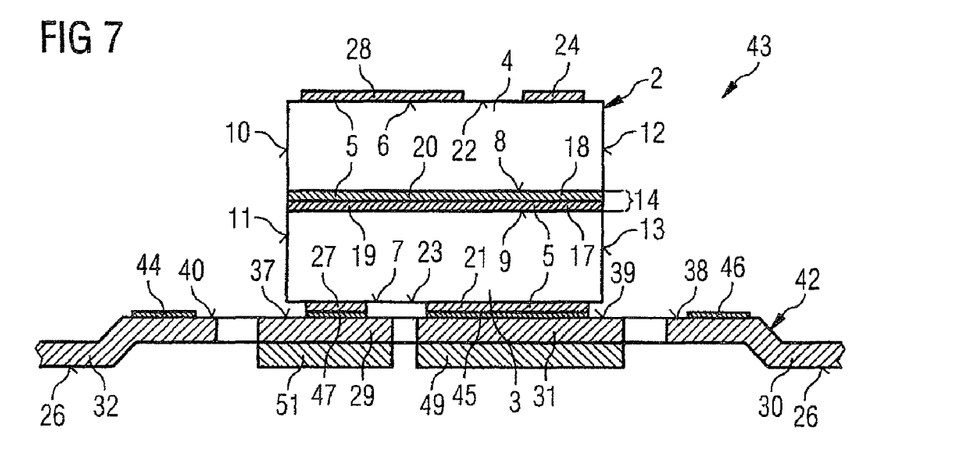
FIG. 7 shows a schematic cross section through the leadframe in accordance with FIG. 6 after the application of a semiconductor chip stack.

FIG. 7 shows a schematic cross section through the leadframe 42 in accordance with FIG. 6 after the application of a semiconductor chip stack 2. The semiconductor chip stack 2 is applied to the central leads 29 and 31 by its underside 23, the large-area lead contact area 45 being connected to the second large-area power electrode of the lower semiconductor chip 3 and the small-area lead contact area 47 being electrically connected to the control electrode 27 on the underside 23 of the semiconductor chip stack 2. This electrical connection can be effected via a conductive adhesive and/or via a solder connection, diffusion solder connections also being possible. In this method state, the electrodes 24 and 28 on the top side 22 of the semiconductor chip stack 2 do not yet have a connection to the outer leads 30 and 32.

Figure 8:
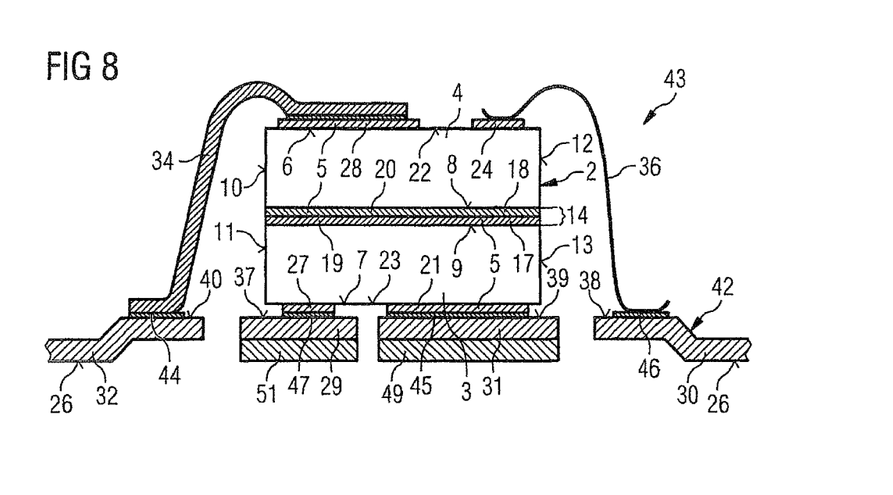
FIG. 8 shows a schematic cross section through the semiconductor chip stack with leadframe in accordance with FIG. 7 after the application of connecting elements.

FIG. 8 shows a schematic cross section through the semiconductor chip stack 2 in accordance with FIG. 7 after the fitting of connecting elements 34 and 36. The connecting element 34 connects the large-area second power electrode 28 of the top side 22 of the chip stack 2 to the large-area lead contact area 44 on the top side 40 of the lead 32 and comprises a bonding tape and/or aluminum bonding wire connections for a high current-carrying capacity. The connecting element 36 in the form of a bonding wire for signal transmissions connects the small-area control electrode 24 on the top side 22 of the semiconductor chip 2 to a small-area lead contact area 46 on the top side 38 of the lead 30.

Figure 9:
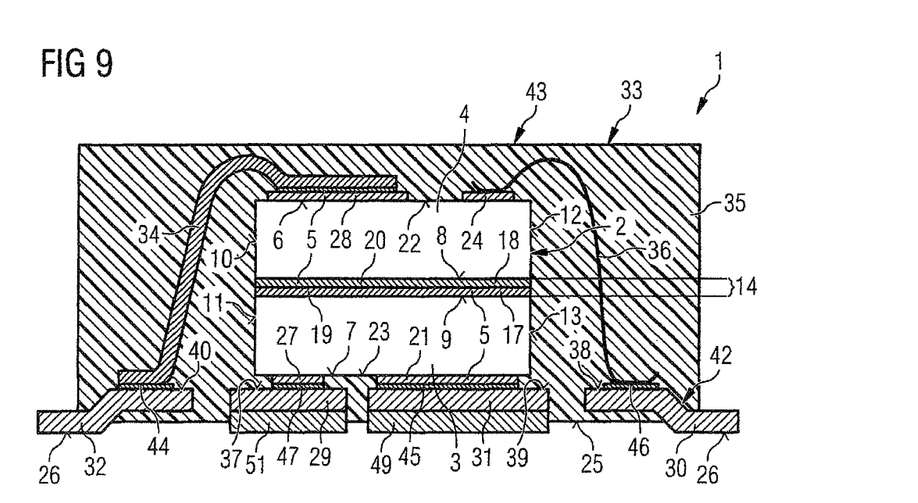
FIG. 9 shows a schematic cross section through the semiconductor chip stack in accordance with FIG. 8 after embedding into a plastic housing composition.

With the fitting of the connecting elements, the semiconductor module is functional and, as shown by FIG. 9, is subsequently embedded into a plastic housing composition.

FIG. 9 shows a schematic cross section through the semiconductor chip stack 2 in accordance with FIG. 8 after embedding into a plastic housing composition 35 on a module position 43 after the separation of the leadframe 42 into individual modules 1. With the embedding of the semiconductor chip stack 2, the connecting elements 34 and 36 and also the top side 37, 38, 39 and 40 of the leads 29, 30, 31 and 32 into a plastic housing composition 35, while leaving free the external contacts 26, 49 and 21 on the underside 25 of the semiconductor module 1, the fabrication of the semiconductor module 1 is concluded.

Figure 10:
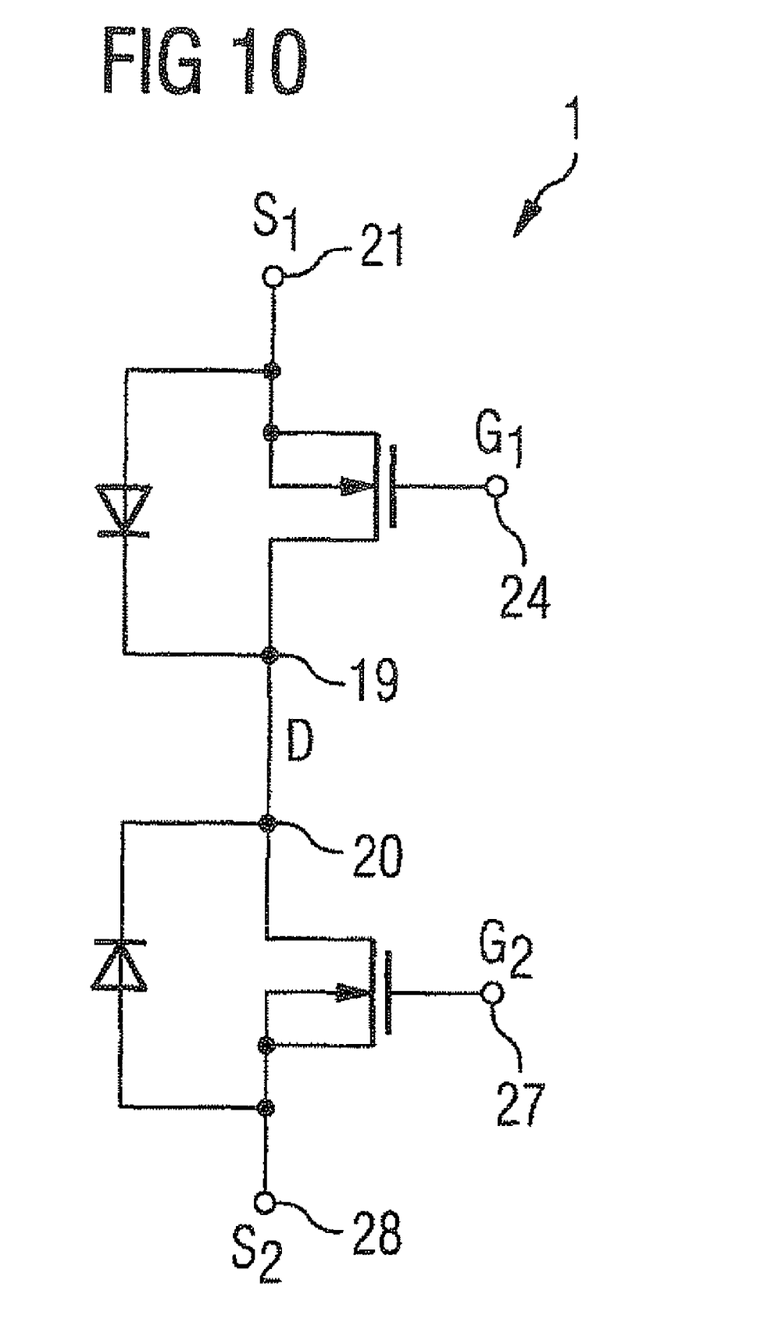
FIG. 10 shows a basic circuit of a semiconductor module with a switching function for the protection of batteries.

FIG. 10 shows a basic circuit of a semiconductor module 1 with a switching function for the protection of batteries. For this purpose, the terminals S1 and S2 for two second power electrodes 21 and 28 as source electrodes and also the control terminals G1 and G2 for two corresponding gate electrodes are routed out of the semiconductor module 1 toward the outside. Jointly and within the semiconductor module 1, the drain electrodes D are electrically connected as first power electrodes 19 and 20.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed:

1. An electronic module with switching functions, the module comprising:
   a pair of integrated circuit chips arranged in a chip stack to provide the switching functions, wherein each of the integrated circuit chips comprises a first power electrode that is disposed on and completely covers a rear side of the integrated circuit chip, the rear sides of the integrated circuit chips facing toward each other, and each of the integrated circuit chips further comprises a second power electrode covering a majority of the surface of a top side of the integrated circuit chip and a small-area control electrode on the top side that has a smaller dimension than the second power electrode, the top sides of the integrated semiconductor chips facing away from each other; and
   a diffusion solder layer arranged between the first power electrodes disposed on the rear sides of the stacked chips, wherein the diffusion solder layer extends to edges of the chips.

2. The electronic module according to claim 1, wherein the diffusion solder layer solder connects the chips together at their rear sides to form the chip stack.

3. The electronic module according to claim 1, further comprising:
   a plurality of external contacts disposed on an underside of the electronic module, the external contacts including:
      two external contacts that connect with the second power electrodes; and
      two external contacts that connect with the control electrodes;
   wherein the diffusion solder layer electrically and mechanically connects the first power electrodes of the semiconductor chips.

4. The electronic module according to claim 1, further comprising a plurality of leads that form surface-mountable flat external contacts of the electronic module, the leads including:
   a first lead electrically connected to the second power electrode on an underside of the chip stack;
   a second lead electrically connected to the control electrode on the underside of the chip stack;
   a third lead electrically connected via a first connecting element to the second power electrode on a top side of the chip stack; and
   a fourth lead electrically connected via a second connecting element to the control electrode on the top side of the chip stack.

5. The electronic module according to claim 4, further comprising:
   a plastic housing that embeds the chip stack, the connecting elements and portions of the leads, wherein external contact areas of the leads on the underside of the electronic module remain exposed and outside of the plastic housing composition.

6. The electronic module according to claim 1, wherein the first power electrode of each integrated circuit chip comprises a drain electrode and the second power electrode of each integrated circuit chip comprises a source electrode of a vertical field effect power semiconductor component.

7. The electronic module according to claim 1, wherein the control electrode of each integrated circuit chip comprises a vertical trench gate electrode.

8. The electronic module according to claim 1, wherein the first power electrode of each integrated circuit chip comprises a collector electrode and the second power electrode of each integrated circuit chip comprises an emitter electrode of a vertical IGBT (insulated gate bipolar transistor), and the control electrode of each integrated circuit chip comprises an insulated gate electrode.

9. The electronic module according to claim 1, wherein the diffusion solder layer comprises a diffusion solder material including at least one of AuSn, AgSn, CuSn, AuSi, AuGe and InAg.

10. An electronic module comprising:
    a pair of integrated circuit chips arranged in a chip stack to provide switching functions, wherein each of the integrated circuit chips includes a top side and a rear side, the integrated circuit chips being arranged such that the rear sides of the chips face toward each other, each of the chips comprises a drain electrode disposed on a rear side of the chip, and each of the integrated circuit chips further comprises a source electrode and a gate electrode disposed at the top side of the chip; and
    a diffusion solder layer arranged between the drain electrodes disposed on the rear sides of the stacked chips.

* * * * *